(12) United States Patent
Cho et al.

(10) Patent No.: US 12,211,688 B2
(45) Date of Patent: Jan. 28, 2025

(54) MANUFACTURING METHOD FOR SILICON NITRIDE THIN FILM, THIN FILM TRANSISTOR AND DISPLAY PANEL

(71) Applicants: Beihai HKC Optoelectronics Technology Co., Ltd., Beihai (CN); HKC CORPORATION LIMITED, Shenzhen (CN)

(72) Inventors: En-Tsung Cho, Beihai (CN); Wanfei Yong, Beihai (CN); Je-Hao Hsu, Beihai (CN); Yuming Xia, Beihai (CN); Haijiang Yuan, Beihai (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/412,645

(22) Filed: Jan. 15, 2024

(65) Prior Publication Data
US 2024/0153757 A1    May 9, 2024

Related U.S. Application Data

(62) Division of application No. 17/344,995, filed on Jun. 11, 2021, now Pat. No. 11,908,683.

(30) Foreign Application Priority Data

Sep. 14, 2020 (CN) .......................... 202010960576.8

(51) Int. Cl.
*H01L 21/02* (2006.01)
*G02F 1/1368* (2006.01)
*H01L 29/786* (2006.01)

(52) U.S. Cl.
CPC ........ *H01L 21/0217* (2013.01); *G02F 1/1368* (2013.01); *H01L 21/02211* (2013.01); *H01L 21/0228* (2013.01); *H01L 29/786* (2013.01)

(58) Field of Classification Search
None
See application file for complete search history.

*Primary Examiner* — Asok K Sarkar

(57) ABSTRACT

A manufacturing method of a silicon nitride thin film, a thin film transistor, and a display panel are disclosed, the method including: providing a silane precursor into an atomic layer deposition apparatus for a preset time period, and remaining the silane precursor for a preset time period; providing an inert gas thereinto for a preset time period for the first time, and purging the silane precursor; providing a nitrogen supplying precursor for a preset time period, and remaining the nitrogen supplying precursor for a preset time period; providing the inert gas for a preset time period for the second time, and purging the nitrogen supplying precursor; repeating for a preset number of times the steps of providing the silane precursor, providing the inert gas for the first time, providing the nitrogen supplying precursor and providing the inert gas for the second time to form the silicon nitride thin film.

8 Claims, 3 Drawing Sheets

MANUFACTURING METHOD FOR SILICON NITRIDE THIN FILM, THIN FILM TRANSISTOR AND DISPLAY PANEL

CROSS-REFERENCES TO RELATED APPLICATION

This application is a division of U.S. patent application Ser. No. 17/344,995 filed Jun. 11, 2021, which is hereby incorporated by reference herein in its entirety.

TECHNICAL FIELD

The present application relates to the field of display technologies, and in particular, to a manufacturing method for a silicon nitride thin film, a thin film transistor and a display panel.

BACKGROUND

The statements herein merely provide background information related to the present application and do not necessarily constitute the conventional art.

Display panels have been rapidly developed and widely used in recent years. In terms of Thin Film Transistor-LCD (TFT-LCD) in the mainstream market, the TFT-LCD includes an array substrate and a Color Filter (CF) substrate, a thin film transistor controlling the on/off of a pixel electrode is formed on the array substrate, and when the thin film transistor is turned on, the pixel electrode generates a voltage, so that liquid crystal molecules are deflected to display a picture.

In the manufacturing of the liquid crystal panel, when the thin film transistor is formed, a phenomenon of Passivation Undercut (PV Undercut) easily occurs while the passivation layer is etched to form the contact hole, which may cause problems such as dark spots in the liquid crystal panel during the use, resulting in abnormal display of the liquid crystal panel.

SUMMARY

The purpose of the present application is to provide a manufacturing method of a silicon nitride thin film, a thin film transistor and a display panel so as to reduce the phenomenon of dark spots in the display of a liquid crystal panel.

The present application discloses a manufacturing method for a silicon nitride thin film including following steps:
providing a silane precursor into an atomic layer deposition apparatus for a preset time period, and remaining the silane precursor for a preset time period after the provision;
providing an inert gas into the atomic layer deposition apparatus for a preset time period for the first time, and purging the silane precursor;
providing a nitrogen supplying precursor into the atomic layer deposition apparatus for a preset time period, and remaining the nitrogen supplying precursor for a preset time period after the provision;
providing the inert gas into the atomic layer deposition apparatus for a preset time period for the second time, and purging the nitrogen supplying precursor; and
repeating for a preset number of times the steps of providing the silane precursor, providing the inert gas for the first time, providing the nitrogen supplying precursor and providing the inert gas for the second time to form the silicon nitride thin film.

The present application also discloses a thin film transistor including a substrate, and a first metal layer, a gate insulating layer, a semiconductor layer, a second metal layer, a passivation layer and a transparent electrode layer which are sequentially formed on the substrate;
the passivation layer includes a first silicon nitride layer formed on the second metal layer and the semiconductor layer, a second silicon nitride layer formed on the first silicon nitride layer, and a third silicon nitride layer formed on the second silicon nitride layer, and the etch rate of the first silicon nitride layer is less than the etch rates of the second silicon nitride layer and the third silicon nitride layer.

The present application also discloses a display panel including a thin film transistor including a substrate, and a first metal layer, a gate insulating layer, a semiconductor layer, a second metal layer, a passivation layer and a transparent electrode layer which are sequentially formed on the substrate;
and the manufacturing method of the passivation layer includes the following steps:
providing a silane precursor into an atomic layer deposition apparatus for a preset time period, and remaining the silane precursor for a preset time period after the provision;
providing an inert gas into the atomic layer deposition apparatus for a preset time period for the first time, and purging the silane precursor;
providing a nitrogen supplying precursor into the atomic layer deposition apparatus for a preset time period, and remaining the nitrogen supplying precursor for a preset time period after the provision;
providing the inert gas into the atomic layer deposition apparatus for a preset time period for the second time, and purging the nitrogen supplying precursor; and
repeating for a preset number of times the steps of providing the silane precursor, providing the inert gas for the first time, providing the nitrogen supplying precursor and providing the inert gas for the second time to form the silicon nitride thin film.

According to the present application, the silicon nitride thin film is manufactured by an atomic layer deposition technology, the passivation layer has three layers, and the display panel serving as high-precision display equipment has very high requirements on the cell gap and the product quality; the total thickness of the passivation layer is small in consideration of the cell gap, and thus the thicknesses of the first silicon nitride layer, the second silicon nitride layer and the third silicon nitride layer are further reduced, and thus causing large adjustments on requirements and quality of the film forming technology. The thickness of each layer of silicon nitride thin film can be accurately controlled by using atomic layer deposition, and meanwhile the film layer is uniform, which meets the thickness requirement of a passivation layer and avoids the conditions of breakage and the like to occur, thus ensuring the product quality.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "horizontally", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The present application will now be described in details by reference to the accompanying drawings and optional embodiments.

Figure 1:
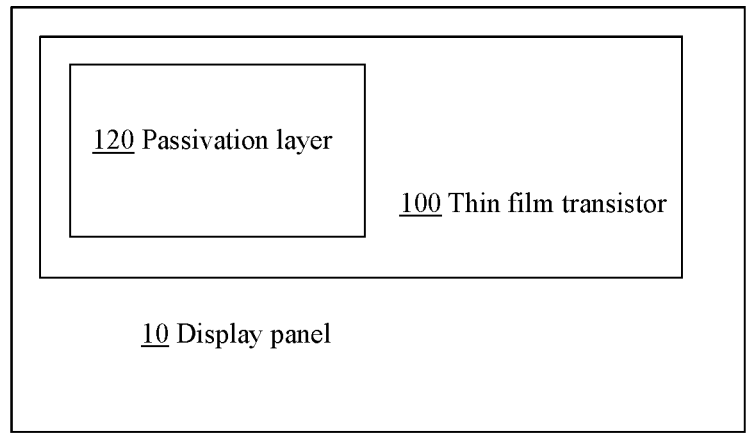
FIG. 1 is a schematic diagram of a display panel according to an embodiment of the present application.
Figure 2:
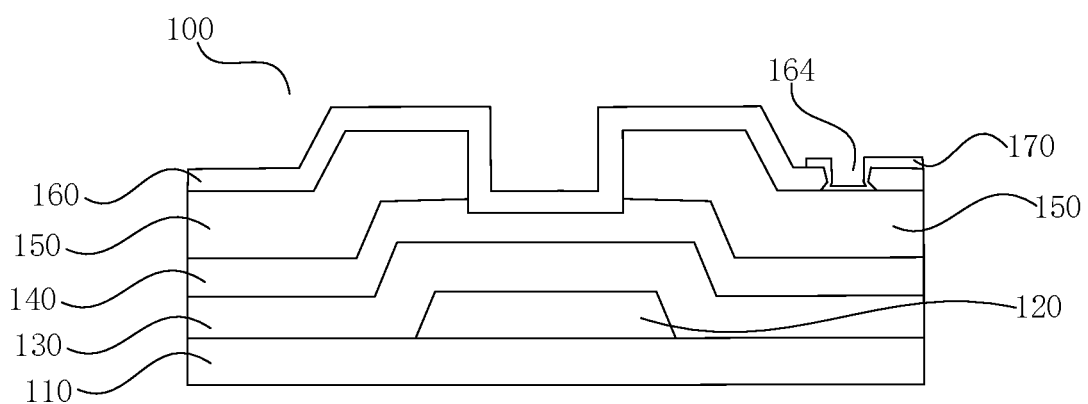
FIG. 2 is a schematic diagram of an improved front contact hole PV Undercut in accordance with an embodiment of the present application.

As another embodiment of the present application, FIG. 1 is a schematic illustration of a display panel, and FIG. 2 is a schematic illustration of a thin film transistor, and particularly, a display panel is disclosed, where the display panel 10 includes a thin film transistor 100 including a substrate 110, and a first metal layer 120, a gate insulating layer 130, a semiconductor layer 140, a second metal layer 150, a passivation layer 160, and a transparent electrode layer 170 which are sequentially formed on the substrate 110.

Figure 3:
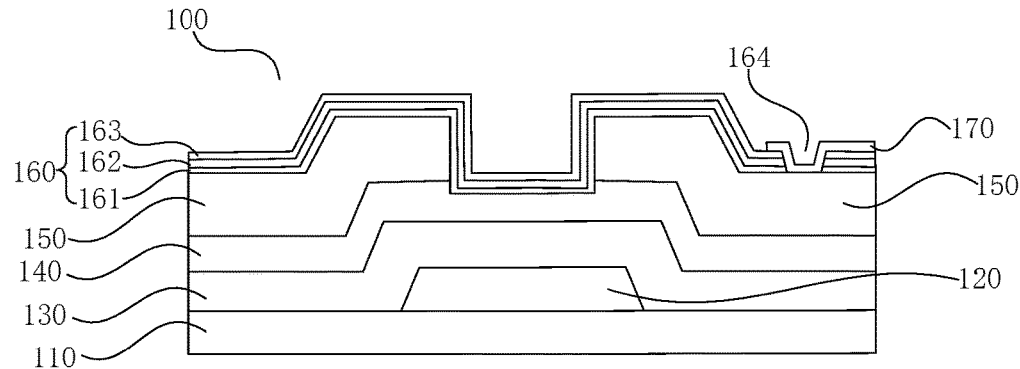
FIG. 3 is a schematic diagram of a passivation layer in accordance with an embodiment of the present application.

As shown in the schematic illustration of the thin film transistor of FIG. 3, the passivation layer 160 includes a first silicon nitride layer 161 formed on the second metal layer 150 and the semiconductor layer 140, a second silicon nitride layer 162 formed on the first silicon nitride layer 161, and a third silicon nitride layer 163 formed on the second silicon nitride layer 162.

The first silicon nitride layer 161 may be formed of $SiN_{x1}$, the second silicon nitride layer 162 may be formed of $SiN_{x2}$, and the third silicon nitride layer 163 may be formed of $SiN_{x3}$, and the value of x1 may be greater than that of x2 and x3. Specifically, the value of x1 ranges from 1.21 to 1.31, the value of x2 ranges from 1.1 to 1.2, and the value of x3 ranges from 1.0 to 1.2.

In the manufacturing of the liquid crystal panel, a phenomenon of PV Undercut easily occurs when the passivation layer 160 is etched to form the contact hole 164. However, the passivation layer 160 near the second metal layer is etched more seriously, so that when the transparent electrode is laid, the film layer at the position is likely to be extremely thin, which results in breakage of the transparent electrode. When the PV Undercut is slight, the problems of dark spots and the like of the liquid crystal panel can be caused in use, lowering the quality of the liquid crystal panel; when the PV Undercut is severe, the display abnormality of the liquid crystal panel may be caused immediately after production.

When the passivation layer 160 is manufactured, the passivation layer 160 is formed by three silicon nitride thin films of a first silicon nitride layer 161, a second silicon nitride layer 162 and a third silicon nitride layer 163, the first silicon nitride layer 161 is formed of $SiN_{x1}$, the second silicon nitride layer 162 is formed of $SiN_{x2}$, the third silicon nitride layer 163 is formed of $SiN_{x3}$, the etching rate of the $SiN_{x1}$ is smaller than that of $SiN_{x2}$ and $SiN_{x3}$, the bottom of the contact hole 164 is hard to erode, and the quality of the liquid crystal panel is improved.

Figure 4:
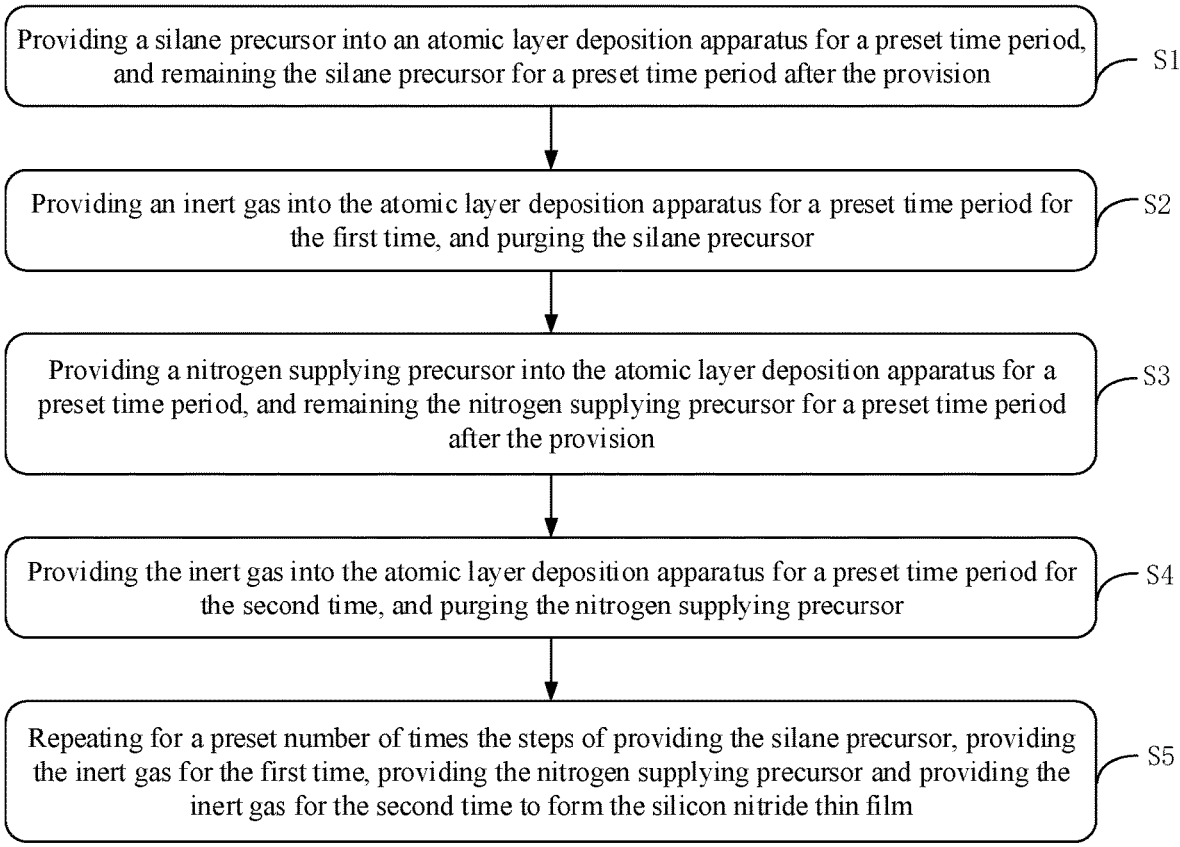
FIG. 4 is a flow chart of a silicon nitride processing method according to an embodiment of the present application.

Specifically, the $SiN_{x1}$, $SiN_{x2}$ and $SiN_{x3}$ may each be manufactured using the following manufacturing method for a silicon nitride thin film, as shown in the schematic flow chart of the silicon nitride of FIG. 4, the manufacturing method for a silicon nitride thin film includes:

S1: providing a silane precursor into an atomic layer deposition apparatus for a preset time period, and remaining the silane precursor for a preset time period after the provision;

S2: providing an inert gas into the atomic layer deposition apparatus for a preset time period for the first time, and purging the silane precursor;

S3: providing a nitrogen supplying precursor into the atomic layer deposition apparatus for a preset time period, and remaining the nitrogen supplying precursor for a preset time period after the provision;

S4: providing the inert gas into the atomic layer deposition apparatus for a preset time period for the second time, and purging the nitrogen supplying precursor;

S5: repeating for a preset number of times the steps of providing the silane precursor 180, providing the inert gas for the first time, providing the nitrogen supplying precursor 190 and providing the inert gas for the second time to form the silicon nitride thin film.

The present application adopts an Atomic Layer Deposition (ALD) technology, which is a special chemical vapor deposition technology, and is a method for forming a thin film by alternately providing vapor-phase precursor pulses into a reaction chamber and performing a chemical adsorption reaction on the surface of a deposition substrate, so that the ALD technology has obvious advantages in the aspects of uniformity, coverage rate, thickness control and the like of the film layer.

The present application adopts ALD technology, the passivation layer 160 has three layers, and the display panel 10 serving as high-precision display equipment has very high requirements on the cell gap and the product quality; the total thickness of the passivation layer 160 is small in consideration of the cell gap, and thus the thicknesses of the first silicon nitride layer 161, the second silicon nitride layer 162 and the third silicon nitride layer 163 are further reduced, and thus causing large adjustments on requirements and quality of the film forming technology. The thickness of each layer of silicon nitride thin film can be accurately controlled by using atomic layer deposition, and meanwhile the film layer is uniform, which meets the thickness requirement of a passivation layer 160 and avoids the conditions of breakage and the like to occur, thus ensuring the product quality.

Figure 5:
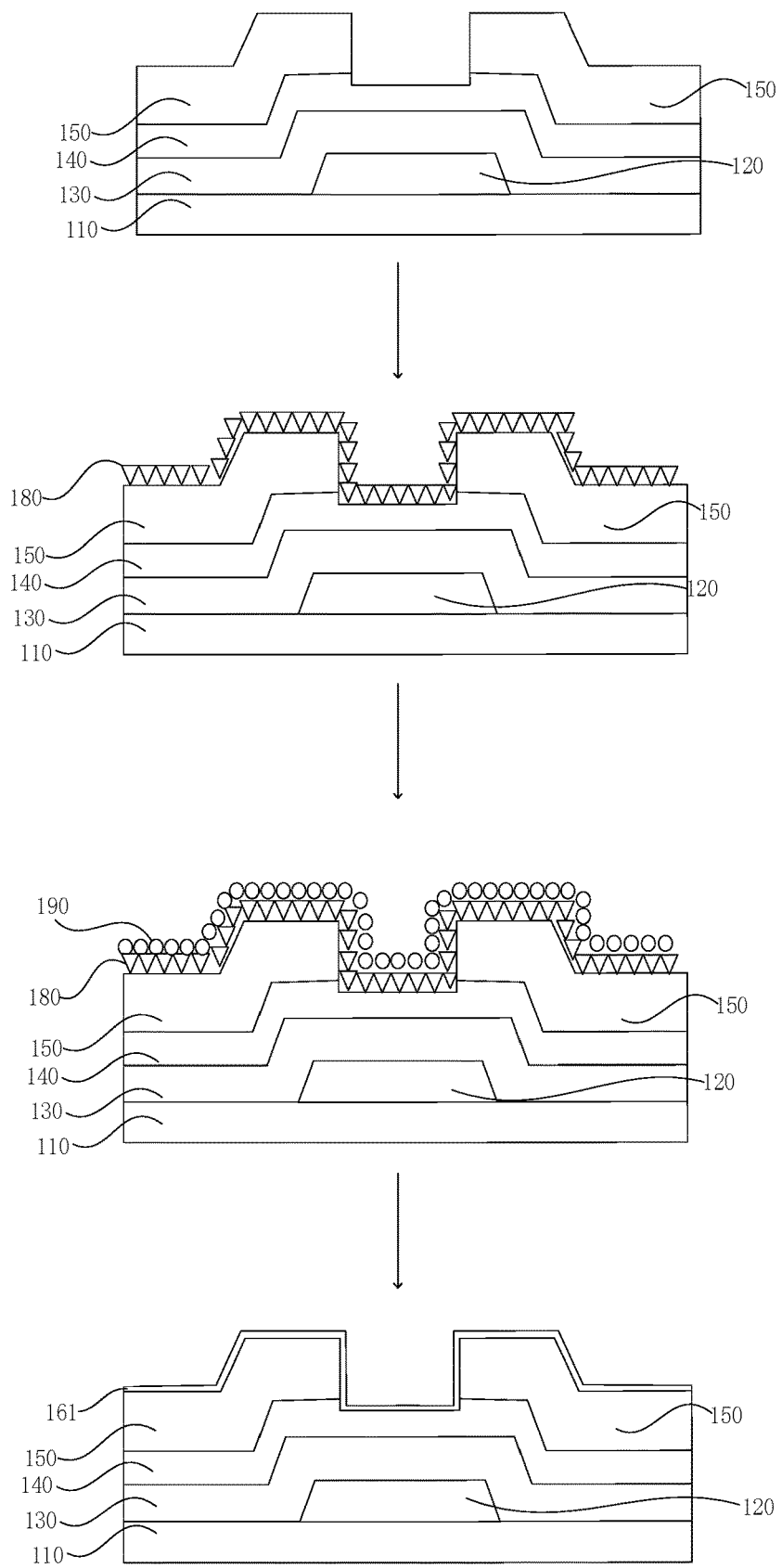
FIG. 5 is a schematic diagram of the formation of one of the silicon nitride layers in accordance with an embodiment of the present application.

In specific steps of forming silicon nitride, as shown in the schematic diagram of silicon nitride film formation shown in FIG. 5, the step of providing the silane precursor 180 makes the silane precursor 180 deposit and attach on the substrate, where the continuous provision time period and remaining time period are critical to subsequent reactions; if the continuous provision time period and the remaining time period are too short, the amount of silane precursor 180 deposited and attached to the substrate will be insufficient; if the continuous provision time period and the remaining time period are too long, part of the silane precursor 180 will be wasted, and the silane precursor 180 is expensive, thereby greatly increasing the production cost. The step of providing the inert gas for the first time is to purge and remove the redundant silane precursor 180 in the atomic layer deposition apparatus, so that the subsequent reaction is prevented from being influenced. The use of the inert gas for purging is because they are chemically inactive and not prone to chemical reactions, thereby leaving the formation of the silicon nitride thin film alone. The step of providing the nitrogen-supplying precursor 190 makes the nitrogen-supplying precursor 190 deposit and attach on the substrate, and react with the silane precursor 180 to generate the silicon nitride thin film, where the continuous provision time period and remaining time period are critical for accurately controlling the generation and production flow of the silicon nitride thin film; if the continuous provision time period and the remaining time period are too short, the amount of the nitrogen-supplying precursor 190 deposited and attached on the substrate is insufficient to supply sufficient reaction amount, and the generated silicon nitride thin film fails to reach the predetermined thickness or requirement; if the continuous provision time period and the remaining time period are too long, part of the nitrogen precursor 190 will be wasted, meanwhile the production time will be increased because of so many repetitions of the steps (i.e., step S5), which leads to a sharp increase of production cost. The step of providing the inert gas for the second time is to purge and remove the redundant nitrogen precursor 190 in the atomic layer deposition apparatus, so that the subsequent reactions in the repeating step are prevented from being influenced. The use of the inert gas for purging is because they are chemically inactive and not prone to chemical reactions, thereby leaving the formation of the silicon nitride thin film alone. In step S5, the steps S1, S2, S3 and S4 may be repeated for different times as required by actual production or product type, so as to precisely adjust the thickness, production cost and the like of the silicon nitride.

Specifically, the preset time period for which the silane precursor 180 is continuously provided is 0.01 to 0.03 seconds, and the preset time period for which the silane precursor remains after the provision is 0.02 to 0.04 seconds. The continuous provision time period is 0.01 to 0.03 seconds, and the remaining time period is 0.02 to 0.04 seconds, which ensures that the provided amount is sufficient for attaching to the substrate, the amount of the silane precursor 180 being provided is appropriate, and the production time is not increased due to remaining time period being too long. It should be noted that, the continuous provision time period and the remaining time period correspond to each other, and if the continuous provision time period is too short, no matter how long the remaining time period is, the silane precursor 180 attached to the substrate is insufficient because of the insufficient provided amount; if the remaining time period is too short, no matter how long the continuous provision time period is, the silane precursor 180 attached to the substrate is insufficient because of the insufficient remaining time.

The preset time period for which the inert gas is continuously purged in the step of providing the inert gas for the first time may be 2 to 10 seconds; and the preset time period for which the inert gas is continuously purged in the step of providing the inert gas for the second time is 15 to 25 seconds. The effect of purging should be guaranteed, while the production time should be taken into account without wasting time. Because the silicon nitride thin film needs reaction of repeated cycle for a plurality of times, even if each time has only slight impact, the formation of the final silicon nitride thin film can also be greatly impacted, so the time period for purging the inert gas for the second time is obviously longer than the time period for purging the inert gas for the first time, ensuring that the residual gas being thoroughly removed, and avoiding to impact on the reaction of the next repeated cycle.

The preset time period of continuous provision for nitrogen supplying precursor 190 may be 3 to 8 seconds, and the preset remaining time period after the provision may be 15 to 25 seconds, which ensures that the provided amount attaching to the substrate is sufficient for reacting to generate desirable silicon nitride thin film, the amount of the nitrogen supplying precursor 190 being provided is appropriate, and the production time is not increased due to remaining time period being too long. It should be noted that, the continuous provision time period and the remaining time period correspond to each other, and if the continuous provision time period is too short, no matter how long the remaining time period is, the nitrogen supplying precursor 190 attached to the substrate for reacting is insufficient because of the insufficient provided amount; if the remaining time period is too short, no matter how long the continuous provision time period is, the nitrogen supplying precursor 190 attached to the substrate for reacting is insufficient because of the insufficient remaining time.

The preset number of times of repeating the steps of providing the silane precursor 180, providing the inert gas for the first time, providing the nitrogen supplying precursor 190 and providing the inert gas for the second time is ranged between 400 to 600, and repeating in this range can make the requirement on the thickness of each film layer and actual products or production met, and the production time or the thickness of the film layer can be adjusted by adjusting the number of repeating times.

Specifically, in the step of providing the silane precursor 180, the silane precursor 180 is provided in the atomic layer deposition apparatus for 0.02 seconds, and the remaining time period is 0.03 seconds, so that sufficient silane precursor 180 can be attached to the substrate to the maximum extent without wasting too much expensive silane precursor 180 and prolonging unnecessary production time. In the step of providing the inert gas for the first time, the inert gas is provided and continuously purged for 5 seconds, so that the silane precursor 180 can be removed to the maximum extent without wasting too much inert gas and prolonging the production time. In the step of providing the nitrogen supplying precursor 190, the nitrogen supplying precursor 190 is provided for 5 seconds, and the remaining time period is 20 seconds, so that sufficient nitrogen supplying precursor 190 can be attached to the substrate to the maximum extent without wasting too much nitrogen supplying precursor 190 and prolonging unnecessary production time. In the step of providing the inert gas for the second time, the inert gas is provided and continuously purged for 20 seconds, so that the nitrogen supplying precursor 190 can be removed to the maximum extent without wasting too much inert gas and prolonging the production time. Repeating for 500 times the steps of providing the silane precursor 180, providing the inert gas for the first time, providing the nitrogen supplying precursor 190 and providing the inert gas for the second time to form the silicon nitride thin film. The 500 repetitions may make the film layer thickness suitable without impacting the total thickness of the passivation layer 160 for being too thick. And the film layer may not likely to break for being too thin.

The silane referred to herein is a compound of silicon and hydrogen, and is a generic name for a series of compounds of silicon and hydrogen, including monosilane (SiH4), disilane (Si2H6), and some higher hydrosilane compounds, as long as they are suitable for use herein. Specifically, the silane precursor 180 used herein may be [NH(C4H9)]2SiH2. The inert gas used in the first and second inert gas provision steps may be Ar, although other inert gases may be used.

The nitrogen precursor 190 used herein corresponds to the first silicon nitride layer 161, the second silicon nitride layer 162, and the third silicon nitride layer 163, and specifically, where in forming the first silicon nitride layer 161 thin film, N2 is used as the nitrogen supplying precursor 190; in forming the second silicon nitride layer 162 thin film, NH3 is used as the nitrogen supplying precursor 190; in forming the second silicon nitride layer 163 thin film, N2+NH3 is used as the nitrogen supplying precursor 190.

It should be noted that, the limitation of the steps involved in this solution, without affecting the implementation of the specific solution, is not determined to limit the sequence of steps, and the previous steps may be executed first, later, or even simultaneously, and shall be deemed to fall within the scope of the present application as long as the solution can be implemented.

The technical solution of the present application can be applied to a wide variety of display panels, such as Twisted Nematic (TN) display panels, In-Plane Switching (IPS) display panels, Vertical Alignment (VA) display panels, Multi-Domain Vertical Alignment (MVA) display panels, and other types of display panels, such as Organic Light Emitting Diode (OLED) display panels.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A thin film transistor comprising a substrate, and a first metal layer, a gate insulating layer, a semiconductor layer, a second metal layer, a passivation layer and a transparent electrode layer which are sequentially formed on the substrate;
    wherein the passivation layer comprises a first silicon nitride layer formed on the second metal layer and the semiconductor layer, a second silicon nitride layer formed on the first silicon nitride layer, and a third silicon nitride layer formed on the second silicon nitride layer, wherein an etching rate of the first silicon nitride layer is less than etching rates of the second silicon nitride layer and the third silicon nitride layer, wherein the first silicon nitride layer, the second nitride layer, and the third nitride layer collectively constitute a silicon nitride film.

2. The thin film transistor according to claim 1, wherein the first silicon nitride layer is formed of $SiN_{x1}$, the second silicon nitride layer is formed of $SiN_{x2}$, and the third silicon nitride layer is formed of $SiN_{x3}$, wherein a value of the shown x1 is greater than that of each of x2 and x3.

3. The thin film transistor according to claim 2, wherein the value of x1 ranges from 1.21 to 1.31, the value of x2 ranges from 1.1 to 1.2, and the value of x3 ranges from 1.0 to 1.2.

4. A display panel comprising a thin film transistor which comprises a substrate, and a first metal layer, a gate insulating layer, a semiconductor layer, a second metal layer, a passivation layer and a transparent electrode layer which are sequentially formed on the substrate;
    wherein the passivation layer comprises a first silicon nitride layer formed on the second metal layer and the semiconductor layer, a second silicon nitride layer formed on the first silicon nitride layer, and a third silicon nitride layer formed on the second silicon nitride layer, wherein an etching rate of the first silicon nitride layer is less than etching rates of the second silicon nitride layer and the third silicon nitride layer, wherein the first silicon nitride layer, the second silicon nitride layer, and the third silicon nitride layer collectively constitute a silicon nitride film.

5. The display panel according to claim 4, wherein the manufacturing method of the passivation layer comprises the following steps:
    providing a silane precursor into an atomic layer deposition apparatus for a preset time period, and remaining the silane precursor for a preset time period after the provision;
    providing an inert gas into the atomic layer deposition apparatus for a preset time period for the first time, and purging the silane precursor;
    providing a nitrogen supplying precursor into the atomic layer deposition apparatus for a preset time period, and remaining the nitrogen supplying precursor for a preset time period after the provision;
    providing the inert gas into the atomic layer deposition apparatus for a preset time period for the second time, and purging the nitrogen supplying precursor; and
    repeating for a preset number of times the steps of providing the silane precursor, providing the inert gas for the first time, providing the nitrogen supplying precursor and providing the inert gas for the second time to form the silicon nitride thin film.

6. The display panel according to claim 5, wherein in forming the first silicon nitride layer thin film, $N_2$ is used as a nitrogen supplying precursor; in forming the second silicon nitride layer thin film, $NH_3$ is used as a nitrogen supplying precursor; and in forming the third silicon nitride layer thin film, $N_2+NH_3$ is used as a nitrogen supplying precursor.

7. The display panel according to claim 6, wherein the first silicon nitride layer is formed of $SiN_{x3}$, the second silicon nitride layer is formed of $SiN_{x2}$, and the third silicon nitride layer is formed of $SiN_{x3}$, wherein the value of the shown x1 is greater than that of x2 and x3.

8. The display panel according to claim 7, wherein the value of x1 ranges from 1.21 to 1.31, the value of x2 ranges from 1.1 to 1.2, and the value of x3 ranges from 1.0 to 1.2.

* * * * *